US011404349B2

(12) United States Patent
Raravikar et al.

(10) Patent No.: US 11,404,349 B2
(45) Date of Patent: Aug. 2, 2022

(54) MULTI-CHIP PACKAGES AND SINTERABLE PASTE FOR USE WITH THERMAL INTERFACE MATERIALS

(71) Applicant: Intel Corporation, Santa Clara, CA (US)

(72) Inventors: Nachiket R. Raravikar, Saratoga, CA (US); Ravindranath V. Mahajan, Chandler, AZ (US); Robert L. Sankman, Phoenix, AZ (US); James C. Matayabas, Jr., Gilbert, AZ (US); Ken P. Hackenberg, Tempe, AZ (US); Nayandeep K. Mahanta, Minneapolis, MN (US); David D. Olmoz, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/343,703

(22) PCT Filed: Dec. 7, 2016

(86) PCT No.: PCT/US2016/065374
§ 371 (c)(1),
(2) Date: Apr. 19, 2019

(87) PCT Pub. No.: WO2018/106226
PCT Pub. Date: Jun. 14, 2018

(65) Prior Publication Data
US 2019/0267306 A1 Aug. 29, 2019

(51) Int. Cl.
*H01L 23/367* (2006.01)
*H01L 23/373* (2006.01)
(Continued)

(52) U.S. Cl.
CPC ........ *H01L 23/3736* (2013.01); *H01L 23/367* (2013.01); *H01L 23/42* (2013.01);
(Continued)

(58) Field of Classification Search
CPC ... H01L 23/3736; H01L 23/367; H01L 23/42; H01L 25/0655; H01L 2224/73253; H01L 2924/16152
See application file for complete search history.

(56) References Cited

U.S. PATENT DOCUMENTS 6,979,899 B2 * 12/2005 Edwards ............... H01L 23/36
257/704
2003/0102356 A1 * 6/2003 Schwarzbauer ....... H01L 24/32
228/121
(Continued)

OTHER PUBLICATIONS

International Preliminary Report and Patentability for International Patent Application No. PCT/US2016/065374, dated Jun. 20, 2019, 10 pages.
(Continued)

*Primary Examiner* — Timor Karimy
(74) *Attorney, Agent, or Firm* — Schwabe, Williamson & Wyatt, P.C.

(57) ABSTRACT

In some embodiments a semiconductor die package includes a package substrate, a plurality of dies each attached to the package substrate, a layer of a thermally conducting sintered paste over the top of each die, a layer of flexible polymer thermal interface material over the sintered paste, and a heat spreader over and thermally connected to the polymer thermal interface material.

11 Claims, 4 Drawing Sheets

(51) Int. Cl.
*H01L 23/42* (2006.01)
*H01L 25/065* (2006.01)

(52) U.S. Cl.
CPC ............... *H01L 25/0655* (2013.01); *H01L 2224/73253* (2013.01); *H01L 2924/16152* (2013.01)

(56) References Cited

U.S. PATENT DOCUMENTS

| | | | |
|---|---|---|---|
| 2008/0001268 A1* | 1/2008 | Lu | H01L 23/3675 257/678 |
| 2008/0128897 A1 | 6/2008 | Chao | |
| 2009/0194864 A1 | 8/2009 | Dang et al. | |
| 2011/0204506 A1 | 8/2011 | Gurrum et al. | |
| 2014/0264800 A1* | 9/2014 | Gowda | H01L 23/4334 257/675 |
| 2014/0264821 A1* | 9/2014 | Tang | B29C 39/10 257/713 |
| 2015/0130045 A1 | 5/2015 | Tseng et al. | |
| 2016/0315030 A1* | 10/2016 | Strader | H01L 23/3737 |

OTHER PUBLICATIONS

International Search Report and Written Opinion for International Patent Application No. PCT/US2016/065374 dated Aug. 30, 2017, 14 pgs.

* cited by examiner

MULTI-CHIP PACKAGES AND SINTERABLE PASTE FOR USE WITH THERMAL INTERFACE MATERIALS

CROSS-REFERENCE TO RELATED APPLICATION

This patent application is a U.S. National Phase Application under 35 U.S.C. § 371 of International Application No. PCT/US2016/065374, filed Dec. 7, 2016, entitled "MULTI-CHIP PACKAGES AND SINTERABLE PASTE FOR USE WITH THERMAL INTERFACE MATERIALS," which designates the United States of America, the entire disclosure of which is hereby incorporated by reference in its entirety and for all purposes.

FIELD

The present application relates to packaging semiconductor and micromechanical dies and in particular to a thermally conducting paste within the package.

BACKGROUND

Multi-chip modules are being developed for high power packages that may be used in servers, desktops, and other devices. A multi-chip module has a single package substrate with multiple chips, dies, pre-packaged dies or some combination of such parts mounted to the substrate. A cover is attached over the substrate to enclose and protect the chips inside. This has the advantage that the chips can be connected together within the package instead of being connected from one package through a system board or motherboard to another package. The direct connection within the single package allows for faster, shorter connections with less power dissipation. A multi-chip module may contain a processor, memory, such as SRAM (Static Random Access Memory) or DRAM (Dynamic Random Access Memory), and external interfaces, such as a chipset. A package may have multiple processors of different types, such as a central processor and a graphics processor, or multiple processors of the same type.

Any central or graphics processor for a high power application requires attention to removing the heat that the processor generates. Other types of dies may also generate heat. A thermal solution such as a heat spreader coupled to the processor and to an external heat radiator is often used. The heat radiator may be fins, a cooling plate, or another thermal system. When multiple chips are enclosed within a single package, the heat requirements may be increased and aggressive thermal solutions may be required that also account for the different chips inside the package.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A thermally conducting solution is described herein that provides a high effective thermal conductivity even when different chips with different dimensions are mounted in the same package. In other words, the described system provides high thermal conductivity and also offers compliance to absorb die height variations under a heat spreader. A layer of a thermally conducting, no-slump, sinterable solder paste covers the top of all of the dies in a multi-chip package. The paste creates a flat plateau, absorbing all the die height variations. A compliant PTIM (Polymer Thermal Interface Material) is dispensed over the paste. An IHS (Integrated Heat Spreader) lands over the PTIM. This combination has a very low package level thermal resistance.

The present description includes a package architecture, a process of creating these architectures, and final applications in MCP (Multi-Chip Package) thermal management. The package architecture has unique materials such as a no-slump type paste creating a flat plateau absorbing the die height deltas and a PTIM to provide compliance. PTIMs have a lower thermal conductivity than the sinter paste described herein, and on their own may fail to meet thermal conductance targets for thick BLTs (Bond Line Thicknesses) which are found in MCPs with variations in the heights of the different dies. The variations may be as much as about 450 µm.

As described herein the die height deltas are absorbed by application of a no-slump type of thermally conducting material that is designed to adhere to the die. Yet the material can create high or low bond-line-thicknesses (BLT) depending upon die height variation. This ultimately provides a flat plateau on which PTIM can subsequently be dispensed with a very thin BLT. Finally the heat spreader or lid may be attached. The PTIM also provides compliance to account for package warpage and lid flatness variations.

Figure 1:
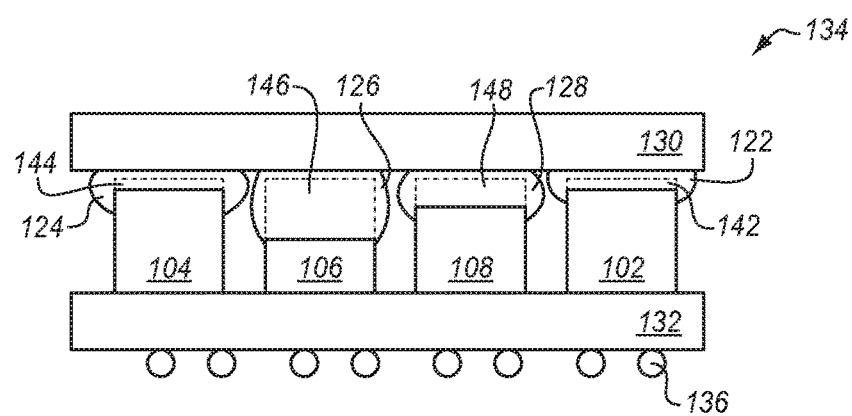
FIG. 1 is a cross-sectional side view diagram of a portion of a multi-chip package with a levelling paste according to an embodiment of the invention.

FIG. 1 is a cross-sectional side view diagram of a portion of a multi-chip package 134. The package has a substrate 132 with a solder ball grid array 136 on one side and multiple chips 102, 104, 106, 108, in this case four chips or dies on the other side. The chips are connected to the ball grid array through redistribution layers or wiring layers (not shown) in the package substrate. There may be more substrates and other components between the chips and the ball grid array, such as isolators, fan-out arrays, interposers, pitch translators, or other components. The package substrate may alternatively have a connection to another substrate instead of a ball grid array, depending on the implementation.

A heat spreader 130 is attached over all of the chips. The heat spreader is thermally coupled to the chips and acts as a heat sink and cooler. The heat spreader is made of a thermally conductive material and may be used as a heat sink or may be coupled to a heat sink. Additional heat management or thermal solutions may be attached to the heat spreader, such as fins, radiators, heat pipes, etc. The heat spreader may also act as a cover or a cover may be placed over the heat spreader.

As shown in this multi-chip package 134, there are large die height variations. The first 104 and fourth 102 dies are much taller than the third die 108 which is much taller than the second die 106. The difference in die height may be caused by the dies being made at different times, by the dies being made using different processing technologies or by the dies being of different types. In some cases a multi-chip package may have multiple chips of the same type, such as multiple memory chips. In some cases, a processor may be combined with a graphics chip and a memory chip. In other cases, a system in a package (SiP) may be assembled by using different types of dies in a single package, such as a processor, a memory, a radio, and a security chip.

For thermal performance each die has a quality thermal coupling to the heat spreader so that the heat spreader can absorb and remove excess heat. The thermal coupling is made through a thermal interface material (TIM) 142, 144, 146, 148 between the heat spreader and each die which is formulated to have very high thermal conductivity, adhesion, and flexibility. The TIM allows the dies and the heat spreader to expand and contract with temperature without losing adhesion. The expansion forces on the TIM are both compression forces as the dies expand and contract and shear forces as the heat spreader expands and contracts laterally.

The difference in height between the tallest die and the shortest die may be very small or very large. In some cases, the height difference may be as much as 450 µm. At this die height difference, the TIM is not able to maintain a consistent high thermal conductivity for all of the dies. The tallest die would experience the maximum compression of the TIM when the IHS is pressed over the die. This results in the minimum BLT. The tallest die is likely to be a CPU die which generates more heat than the other dies. The TIM for the shortest die would experience the minimum compression when the IHS is pressed into place and therefore have the maximum BLT. This higher BLT results in higher thermal resistance. As a result, the smaller die will not be cooled as effectively as the taller die.

In FIG. 1, there is another layer 142, 144, 146, 148 over each die between the die and the corresponding TIM layer. This additional layer creates a flat plateau on top of each die, absorbing the die height deltas. The additional layer is a paste formulation similar to a solder paste that is configured to create flat surfaces across the dies of the MCPs. In this way, the paste absorbs large die height differences. The paste is thicker over the shorter dies and thinner over the taller dies so that the TIM has about the same thickness over all of the dies. Due to the similar thickness, the thermal conductivity of the TIM is about the same for each die. The paste, as described in more detail below, is highly conductive so that the differences in the paste thickness do not significantly affect the thermal conductivity of the paste. On the other hand, the TIM may lose some thermal conductivity in favor of being flexible and adhesive to compensate for thermal changes to the package 134.

Figure 2:
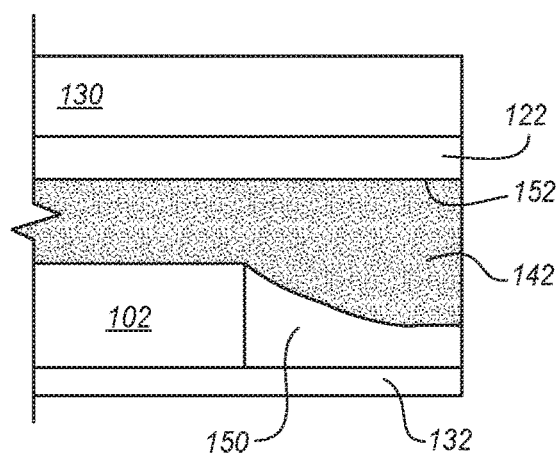
FIG. 2 is an enlarged cross-sectional side view diagram of an end of a die in the multi-chip package of FIG. 1 according to an embodiment of the invention.

FIG. 2 is a more detailed cross-sectional side view diagram of an end of one of the dies of FIG. 1 in the package 134. In this view the die 102 is attached to the substrate 132 using a solder ball, land grid or other type of electrical and physical connection. The connection has been covered and sealed with an underfill 150. The paste 142 is applied over the die and over the underfill to form a large flat ledge 152 over the die and over some area around the die that includes the underfill. The TIM 122 is then applied over the flat ledge of paste. The TIM has a mostly even thickness or BLT and the heat spreader 130, for example an IHS, is attached to the die by the TIM.

Figure 3:
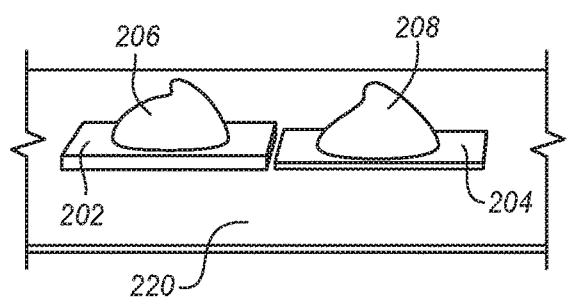
FIG. 3 is an isometric view diagram of a sinterable leveling paste on dies on a package substrate according to an embodiment.

FIG. 3 is an isometric view diagram of a sinterable leveling paste on dies. A first 202 and second 204 die are placed on a platform or tray 220. Alternatively, the dies may already be mounted to a package substrate as in FIG. 1. The mounting may include underfill as shown in FIG. 2. A dose of paste 206, 208 is then dispensed over each die. The paste is then flattened or leveled. The level paste is shown, for example, in FIG. 4.

Figure 4:
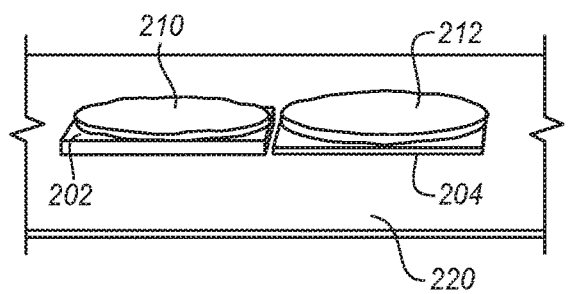
FIG. 4 is an isometric view diagram of the dispensed leveling paste of FIG. 3 after leveling and sintering according to an embodiment.

FIG. 4 is an isometric view diagram of the dispensed leveling paste of FIG. 3 after leveling and sintering. The leveled paste 210, 212 of FIG. 4 presents a plateau for the TIM as described above. When the paste is applied after the dies are mounted then a leveling operation levels the paste with respect to the package substrate. When the heat spreader is parallel to the package substrate, then the flattened paste presents a level surface that is also parallel to the package substrate for a conventional rectangular package. While the paste is shown as covering only a portion of the die, the paste may alternatively cover the entire die as shown in FIG. 2.

A die height delta as large as 400 µm or more may be compensated by a dispensed no-slump paste as shown in FIG. 3. The paste may then be flattening using polytetrafluoroethylene, e.g. Teflon® sheets or sheets that are press coated with Teflon. The paste may then be sintered to form a rigid structure for the application of the TIM. Teflon is easily removed before or after sintering. The Teflon leaves the flat surface, on which a TIM may then be dispensed. The flat plateaus of the no-slump paste absorb the die height variations in this way.

In some embodiments, the no-slump paste is dispensed onto each die and then flattened by pressing into the paste with a non-stick flat surface, such as a metal or other rigid plate coated with Teflon or another non-stick surface. The plate may be removed after pressing or the whole system may be sintered after which the plate is removed. In either case, the non-stick surface is selected to not bond with the paste even during sintering.

The no-slump paste material 206, 208 may be applied in a variety of different ways to create the flat surfaces 210, 212. In some embodiments, the top of the die is coated with a layer of the thermally conducting no-slump paste by printing. The paste surface may be leveled by a squeegee resting on a stencil, a linear guide or a similar flat surface. The thickness of the squeegeed paste layer is controlled by the thickness of the stencil.

Figure 5:
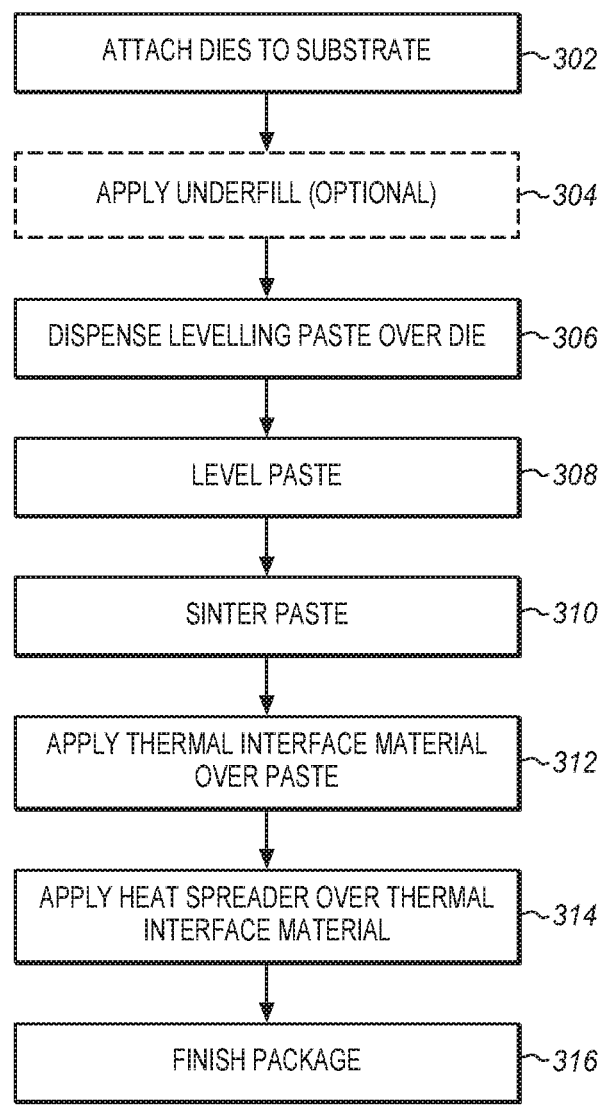
FIG. 5 is a process flow diagram of assembling a package with different die heights using a levelling paste according to an embodiment.

FIG. 5 is a process flow diagram of suitable operations for assembling a package using different die heights. At 302 multiple dies are attached to a substrate. As mentioned these may be using a ball attach, pad attach, or the dies may have wire leads and be attached directly with an adhesive. At 304 for solder ball attachment an underfill is optionally injected under the dies and flowed and cured to attach the dies to the substrate. The dies are shown herein as having different heights. This allows the paste to compensate for the differences in height and present a level flat plateau for the TIM. However, the dies may also be all the same height. A conventional TIM works best within a particular narrow range of bond line thicknesses. If the distance between any one die and the heat spreader is greater than this preferred range, then the levelling paste may be used to reduce this distance. This allows the TIM to operate in its best range for higher performance.

After the dies are attached at 306 a layer of paste is applied over the dies and at 308 the paste is leveled. After applying the paste, the paste is sintered or reflowed at 310. This causes conductive particles within the paste to bond with each other. This step improves thermal conduction. A variety of different pastes are described herein. For metal particles and solder-like bonding materials, sintering may be at a temperature of about 150-200° C. for about 15-30 minutes. Different paste compositions may use different temperatures and durations. After the paste is sintered it hardens, providing a stable flat surface that is able to compensate for the die height differences.

A 312 a TIM is dispensed over the leveled, hardened paste surface. Any of a variety of different materials may be used. In some embodiments, any flexible, adhesive, thermally conductive material may be used. This includes a polymer thermal interface material (PTIM). After the TIM is dispensed onto this surface a lid attach process may then be performed at 314. This may include dispensing sealant on the lid attach lands of the substrate, placing the lid, and then curing the sealant followed by curing the TIM. The package is finished at 316 with any other connectors, sealants, heat sinks, etc. at 316.

Figure 6:
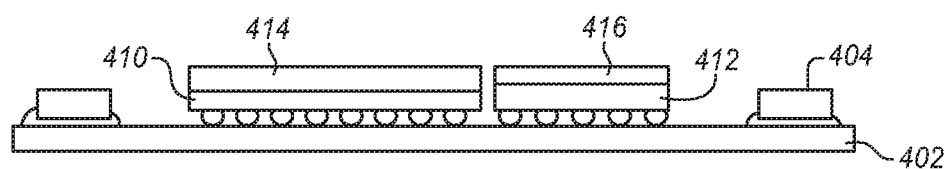
FIG. 6 is a cross-sectional side view diagram of a partially assembled package after paste sintering according to an embodiment.

FIG. 6 is a cross-sectional side view diagram of a partially assembled package after the sintering at 310. The partially assembled package has a package substrate 402 with lid attach lands 404 that form a ridge around the perimeter of the substrate. A first 410 and second 412 die are attached to the substrate. A paste layer 414, 416 has been applied to each die. The paste has been leveled and sintered. As shown the paste presents a flat surface to a TIM notwithstanding the difference in die heights. In other words, the paste creates a flat plateau absorbing the die height variations.

Figure 7:
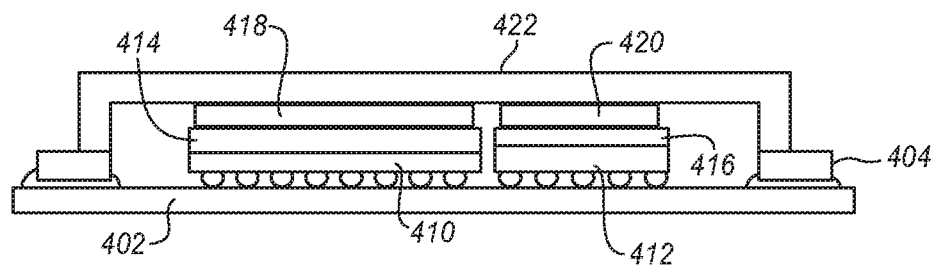
FIG. 7 is a cross-sectional side view diagram of the package of FIG. 6 after assembly according to an embodiment.

FIG. 7 is an example of the package after the TIM 418, 420 is applied and the lid 422 is attached. In this simple package, the lid serves as the heat spreader. The package may be finished by attaching a solder ball or land grid array to the bottom of the substrate. A cooler or heat sink may optionally be attached or coupled to the lid, depending on the thermal design of the die. In some embodiments, the package will first be attached to a system or mother board and then a cooler will be attached to the package.

The unique sinterable paste described herein has a rigid form after sintering and may be pressed into different shapes. It is also highly thermally conductive. For a simpler package that requires less cooling, the TIM and lid may be removed. Instead, a layer of the no-slump paste is applied and covers the die surface. This paste is then sintered and left exposed. The paste alone provides heat spreading and hot spot smearing benefits. It also provides a protective rigid structure around the die. As shown in FIG. 2, the paste may extend down to an underfill layer or down to the surface of the substrate to encapsulate the die.

When a PTIM is used over the paste, the paste is not required to be flexible or to have strong adhesion through thermal changes. These characteristics may be provided by the PTIM instead. These characteristics also tend to reduce thermal conductivity so the paste can instead be designed for thermal conductivity and low or no slump properties. The PTIM may continue to be used to provide flexibility through thermal stress and adhesion.

Any of a variety of different pastes may be used as the die leveling paste. The paste may have a thermal conductivity greater than 15-50 W/mK or more. Electrical conductivity is not required, so the paste may have a low or high electrical conductivity. The paste is described as a no-slump paste meaning that the surface height of the paste does not change significantly after it is deposited especially after it is sintered. In other words, the height of the top surface does not slump down more than about 20% of its original height. For a very large die height variation of 450 µm, the paste will not slump more than about 110 µm so that it remains at least at a height of about 390 µm. Of course for thinner paste layers, the reduction in height will be less. The no-slump property is determined by a combination of a sufficiently high viscosity and a sufficiently high thixotropy. Different specific values may be combined to achieve the desired properties.

The paste may be made of a variety of different combinations of materials. In some embodiments the paste includes one or more high melting point metals. The metals may be more than 50% of the composition by weight. Suitable metals include copper, nickel, aluminum, or other metals with good thermal conductivity. The paste may also include a component which can sinter the particles together, such as tin, tin alloys, and other solder alloys. It also includes a component which acts as a flux to protect the metals from oxidation and to allow sintering. Any of a variety of different organic binders may also be in the paste composition, such as epoxy, which crosslinks and provides a matrix for better mechanical integrity.

The multi-chip packages herein may include a solder ball connection array attached to the bottom surface of any of the package substrates herein. The solder balls may be reflowed to attach the package to a printed circuit board (not shown). The substrate may contain routing traces, surface pads, power/ground planes and vias, etc., which electrically connect the solder balls with solder bumps of the attached chips. Although solder balls are shown and described any of a variety of other connection may be used including pins, lands and pad.

The chips generate heat, which is removed from the chips through the IHS. The IHS is thermally coupled to the chips by the PTIM through the sintered levelling paste to absorb heat from the chips and spread it across the larger surface of the IHS. The heat spreader may comprise metal and metal alloys optionally with a coating of another metal or may comprise a thermally conductive composite material. The PTIM is between the chips and the heat spreader to connect the two pieces together, to absorb mechanical stress from thermal cycling and to conduct heat.

A further heat sink (not shown) may be attached to the heat spreader to enhance heat removal. In some examples, the heat sink is a metal plate with a plurality of fins, however, liquid coolers, heat pipes, or larger plates may be used. A thermal grease or a phase change material may be applied between the MS and the heat sink. Heat also typically flows from the chips through the solder bumps into the substrate. This substrate may have metal heat conducting layers to remove heat from the package. Heat will also flow from the substrate through the solder balls into the socket or system board (not shown) to which the package is attached.

The packages herein are shown as examples. A variety of other simpler or more complex packages may be used. There may be more or fewer dies in the package and more or fewer substrates including translation and interposer substrates. The package may be designed for or include a socket or attach directly to a system board or other surface. The dies may be flipped, upright, or placed in any other position.

While the application refers to a semiconductor die, a micromechanical, or optical die may be used instead. The die may be silicon, ceramic, lithium niobate, gallium arsenide, or any other material or combination thereof. While the heat spreader is shown as surrounding and sealing the die against the package substrate, it may take other forms and may expose a portion of the die to ambient or another controlled environment.

Figure 8:
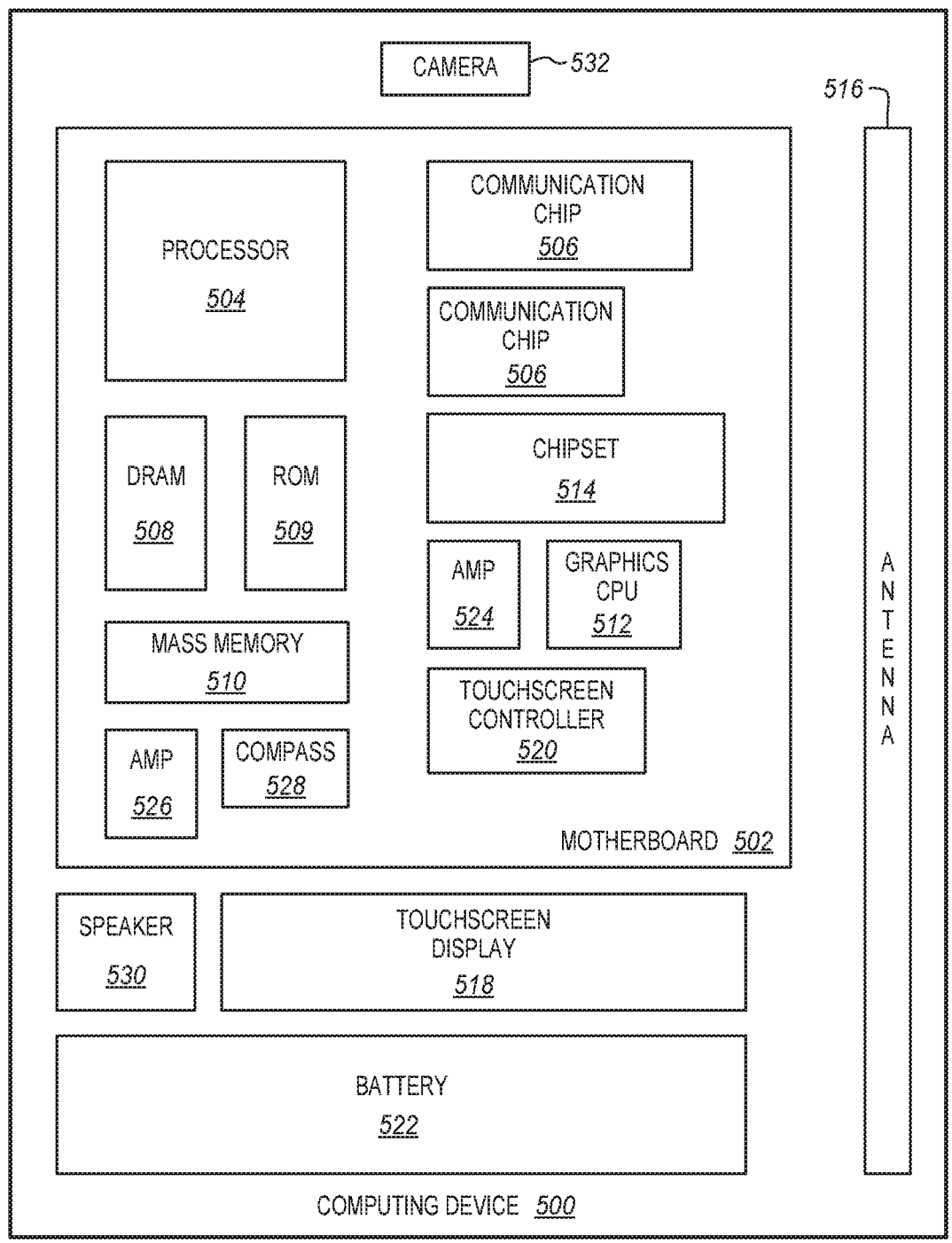
FIG. 8 is a block diagram of a computing device incorporating a microelectronic package according to an embodiment of the invention.

FIG. 8 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged using a levelling paste as described herein. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment". "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor die package that includes a package substrate, a plurality of dies each attached to the package substrate, a layer of a thermally conducting sintered paste over the top of each die, a layer of flexible polymer thermal interface material over the sintered paste, and a heat spreader over and thermally connected to the polymer thermal interface material.

Further embodiments include a lid over the heat spreader.

In further embodiments at least some dies have a different height from the package substrate, and wherein the sintered paste compensates for the different height so that the polymer thermal interface material has about a same thickness over each die.

In further embodiments the sintered paste has a thermal conductivity greater than 15 W/mK.

In further embodiments the sintered paste comprises over 50% by weight of a metal filler and a solder alloy to cause the metal filler to sinter.

In further embodiments the sintered paste comprises an organic binder.

In further embodiments the paste has a slump no greater than 20% before sintering.

Some embodiments pertain to a method of assembling a multiple die package that includes attaching a plurality of dies to a package substrate, dispensing a layer of a thermally conducting sinterable paste over the top of each die, sintering the paste, dispensing a compliant thermal interface material over the paste over each die, and applying an integrated heat spreader over the thermal interface material.

In further embodiments the dies have height variations from the package substrate and wherein dispensing a layer of paste comprises creating flat plateau absorbing die height variations.

Further embodiments include leveling the dispensed paste over each die.

In further embodiments leveling comprises placing a stencil over the dies and applying a squeegee to the paste over the stencil.

In further embodiments leveling comprises applying a plate over the paste and pressing the paste against the dies.

In further embodiments dispensing the paste comprises printing the paste.

Further embodiments include curing the polymer thermal interface material.

In further embodiments the sintered paste has a thermal conductivity greater than 15 W/mK. 5

In further embodiments the sintered paste comprises over 50% by weight of a metal filler and a solder alloy to cause the metal filler to sinter.

In further embodiments the sintered paste comprises an organic binder.

Some embodiments pertain to a computing system that includes a system board, a mass memory connected to the system board, and a processor package coupled to the mass memory through the system board, the processor package including a package substrate, a plurality of dies including a processor die each attached to the package substrate, a layer of a thermally conducting sintered paste over the top of each die, a layer of flexible polymer thermal interface material over the sintered paste, and a heat spreader over and thermally connected to the polymer thermal interface material.

In further embodiments the sintered paste has a thermal conductivity greater than 15 W/mK.

In further embodiments the sintered paste comprises over 50% by weight of a metal filler and a solder alloy to cause the metal filler to sinter.

In further embodiments the paste has height above the substrate that is level over each die.

What is claimed is:

1. A semiconductor die package comprising:
   a package substrate;
   a plurality of dies each attached to the package substrate, the plurality of dies comprising a first die having a first thickness and a second die having a second thickness, the second thickness less than the first thickness;
   a first layer of thermally conducting sintered paste over the top of the first die, the first layer of thermally conducting sintered paste having a thickness;
   a second layer of thermally conducting sintered paste over the top of the second die, the second layer of thermally conducting sintered paste having a thickness greater than the thickness of the first layer of thermally conducting sintered paste over the top of the first die;
   a first layer of flexible polymer thermal interface material over the first layer of thermally conducting sintered paste, the first layer of flexible polymer thermal interface material in direct contact with the first layer of the thermally conducting sintered paste;
   a second layer of flexible polymer thermal interface material over the second layer of thermally conducting sintered paste, the second layer of flexible polymer thermal interface material in direct contact with the second layer of the thermally conducting sintered paste; and
   a heat spreader over and thermally connected to the first and second layers of polymer thermal interface material.

2. The package of claim 1, further comprising a lid over the heat spreader.

3. The package of claim 1, wherein each of the first and second layers of thermally conducting sintered paste has a thermal conductivity greater than 15 W/mK.

4. The package of claim 1, wherein each of the first and second layers of thermally conducting sintered paste comprises over 50% by weight of a metal filler and a solder alloy to cause the metal filler to sinter.

5. The package of claim 1, wherein each of the first and second layers of thermally conducting sintered paste comprises an organic binder.

6. The package of claim 1, wherein each of the first and second layers of thermally conducting sintered paste has a slump no greater than 20% before sintering.

7. The package of claim 1, wherein the first and second layers of thermally conducting sintered paste have co-planar uppermost surfaces.

8. The package of claim 1, wherein the first and second layers of polymer thermal interface material have a same thickness.

9. The package of claim 1, wherein the first layer of polymer thermal interface material is further along sidewalls of the first layer of thermally conducting sintered paste.

10. The package of claim 1, wherein the second layer of polymer thermal interface material is further along sidewalls of the second layer of thermally conducting sintered paste.

11. The package of claim 1, wherein the first layer of polymer thermal interface material is further along sidewalls of the first layer of thermally conducting sintered paste, and wherein the second layer of polymer thermal interface material is further along sidewalls of the second layer of thermally conducting sintered paste.

* * * * *